United States Patent
Kim et al.

(10) Patent No.: US 11,705,430 B2
(45) Date of Patent: Jul. 18, 2023

(54) SEMICONDUCTOR PACKAGE INCLUDING MOLD LAYER HAVING CURVED CROSS-SECTION SHAPE

(71) Applicant: SAMSUNG ELECTRONICS CO., LTD., Suwon-si (KR)

(72) Inventors: Taehyeong Kim, Suwon-si (KR); Young Lyong Kim, Anyang-si (KR); Geol Nam, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/183,786

(22) Filed: Feb. 24, 2021

(65) Prior Publication Data

US 2021/0183821 A1   Jun. 17, 2021

Related U.S. Application Data

(62) Division of application No. 16/225,074, filed on Dec. 19, 2018, now Pat. No. 10,964,670.

(30) Foreign Application Priority Data

Jan. 24, 2018   (KR) .................. 10-2018-0008670

(51) Int. Cl.
   *H01L 25/065*   (2023.01)
   *H01L 23/00*   (2006.01)
   (Continued)

(52) U.S. Cl.
   CPC ........ *H01L 25/0657* (2013.01); *H01L 21/563* (2013.01); *H01L 21/565* (2013.01);
   (Continued)

(58) Field of Classification Search
   CPC combination set(s) only.
   See application file for complete search history.

(56) References Cited

U.S. PATENT DOCUMENTS

7,838,974 B2   11/2010   Poddar et al.
7,863,109 B2    1/2011   Chow et al.
   (Continued)

FOREIGN PATENT DOCUMENTS

JP   2003-115563 A   4/2003
JP   2006-173416 A   6/2006
   (Continued)

*Primary Examiner* — Jesse Y Miyoshi
(74) *Attorney, Agent, or Firm* — Sughrue Mion, PLLC

(57) ABSTRACT

Disclosed are semiconductor packages and methods of manufacturing the same. The method of manufacturing a semiconductor package may include providing a carrier substrate having a trench formed on a first top surface of the carrier substrate, providing a first semiconductor chip on the carrier substrate, mounting at least one second semiconductor chip on a second top surface of the first semiconductor chip, coating a mold member to surround a first lateral surface of the first semiconductor chip and a second lateral surface of the at least one second semiconductor chip, and curing the mold member to form a mold layer. The trench may be provided along a first edge of the first semiconductor chip. The mold member may cover a second edge of a bottom surface the first semiconductor chip.

15 Claims, 12 Drawing Sheets

(51) Int. Cl.
*H01L 23/31* (2006.01)
*H01L 25/00* (2006.01)
*H01L 21/56* (2006.01)

(52) U.S. Cl.
CPC ........ *H01L 21/568* (2013.01); *H01L 23/3114* (2013.01); *H01L 23/3157* (2013.01); *H01L 24/17* (2013.01); *H01L 21/561* (2013.01); *H01L 25/50* (2013.01); *H01L 2225/06513* (2013.01); *H01L 2225/06541* (2013.01); *H01L 2225/06565* (2013.01); *H01L 2225/06582* (2013.01); *H01L 2225/06586* (2013.01)

(56) References Cited

U.S. PATENT DOCUMENTS

| | | | |
|---|---|---|---|
| 8,124,459 | B2 | 2/2012 | Yoon et al. |
| 8,786,064 | B2 | 7/2014 | Kim et al. |
| 9,685,421 | B2 | 6/2017 | Aleksov et al. |
| 9,741,694 | B2 | 8/2017 | Yu et al. |
| 2004/0046238 | A1 | 3/2004 | Hwee et al. |
| 2007/0108605 | A1 | 5/2007 | Yoon et al. |
| 2009/0072367 | A1 | 3/2009 | Poddar et al. |
| 2009/0160045 | A1 | 6/2009 | Sun et al. |
| 2010/0140809 | A1 | 6/2010 | Chow et al. |
| 2012/0088332 | A1 | 4/2012 | Lee et al. |
| 2013/0026655 | A1 | 1/2013 | Lee et al. |
| 2013/0032947 | A1* | 2/2013 | Park ............... H01L 21/568 257/777 |
| 2013/0105955 | A1 | 5/2013 | Kim et al. |
| 2013/0264706 | A1 | 10/2013 | Lee et al. |
| 2015/0171034 | A1 | 6/2015 | Yu et al. |
| 2015/0262968 | A1 | 9/2015 | Aleksov et al. |
| 2017/0179049 | A1 | 6/2017 | Koch et al. |
| 2017/0194290 | A1 | 7/2017 | Yu et al. |
| 2017/0194291 | A1 | 7/2017 | Yu et al. |

FOREIGN PATENT DOCUMENTS

| | | |
|---|---|---|
| KR | 20110123461 A | 11/2011 |
| KR | 1020120035719 A | 4/2012 |
| KR | 1020130012500 A | 2/2013 |
| KR | 1020130015885 A | 2/2013 |

\* cited by examiner

SEMICONDUCTOR PACKAGE INCLUDING MOLD LAYER HAVING CURVED CROSS-SECTION SHAPE

CROSS-REFERENCE TO RELATED APPLICATION

This is a Divisional application of U.S. application Ser. No. 16/225,074, filed on Dec. 19, 2018, which claims priority from Korean Patent Application No. 10-2018-0008670, filed on Jan. 24, 2018, in the Korean Intellectual Property Office, the disclosure of which is incorporated herein in its entirety by reference.

BACKGROUND

1. Field

Apparatuses and methods consistent with example embodiments relate to a semiconductor package and a method of manufacturing the same.

2. Description of the Related Art

The electronics industry has delivered its promise of providing inexpensive electronic products having characteristics such as light weight, compact size, high speed, and high performance. A semiconductor package is provided to implement an integrated circuit chip for use in electronic products. Various researches are required to enhance performance of the semiconductor package. In particular, the through silicon via (TSV) technology has been suggested as the solution for meeting the requirements of high performance needed in the semiconductor package where wire bonding technology had been used traditionally.

Electronic products tend to demand more integrated circuits in an integrated circuit package while ironically providing less physical space in the system for the increased integrated circuit contents. Some technologies then focus on stacking such integrated circuits into a single package. Other approaches to semiconductor packaging stack multiple integrated circuit dice, offer package-in-package (PIP), or a combination thereof.

SUMMARY

Some example embodiments provide a semiconductor package having improved structural stability.

Some example embodiments provide a method of manufacturing a semiconductor package, in which method a fail rate is decreased.

According to an aspect of an example embodiment, a method of manufacturing a semiconductor package may include: providing a carrier substrate having a trench formed on a first top surface of the carrier substrate; providing a first semiconductor chip on the carrier substrate; mounting at least one second semiconductor chip on a second top surface of the first semiconductor chip; coating a mold member to surround a first lateral surface of the first semiconductor chip and a second lateral surface of the at least one second semiconductor chip; and curing the mold member to form a mold layer. The trench may be provided along a first edge of the first semiconductor chip. The mold member may cover a second edge of a bottom surface of the first semiconductor chip.

According to an aspect of an example embodiment, a semiconductor package may include: a chip stack including a first semiconductor chip, at least one second semiconductor chip mounted on a top surface of the first semiconductor chip, and a plurality of connection terminals disposed below the first semiconductor chip; and a mold layer surrounding a first lateral surface of the chip stack. The mold layer may include: a first segment surrounding a second lateral surface of the first semiconductor chip and a third lateral surface of the at least one second semiconductor chip, and a second segment extending from a first bottom end of the first segment and covering an edge of a bottom surface of the first semiconductor chip.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION OF EMBODIMENTS

Figure 1:
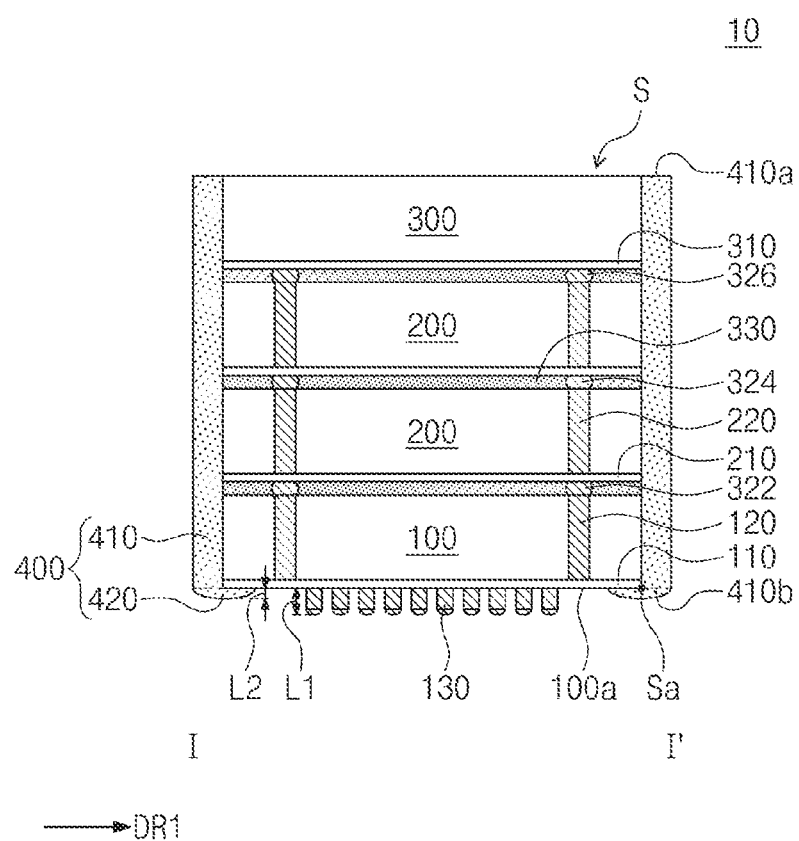
FIG. 1 illustrates a cross-sectional view showing a semiconductor package according to an example embodiment.

Reference will now be made in detail to example embodiments, with reference to the accompanying drawings. In the drawings, parts irrelevant to the description are omitted to clearly describe the example embodiments, and like reference numerals refer to like elements throughout the specification. In this regard, the present example embodiments may have different forms and should not be construed as being limited to the descriptions set forth herein.

Throughout the specification, when it is described that a certain element is "connected" to another element, it should be understood that the certain element may be "directly connected" to another element or "electrically connected" to another element via another element in the middle. In addition, when a component "includes" an element, unless there is another opposite description thereto, it should be understood that the component does not exclude another element but may further include another element.

Hereinafter, the present disclosure is described in detail with reference to the accompanying drawings.

Figure 2:
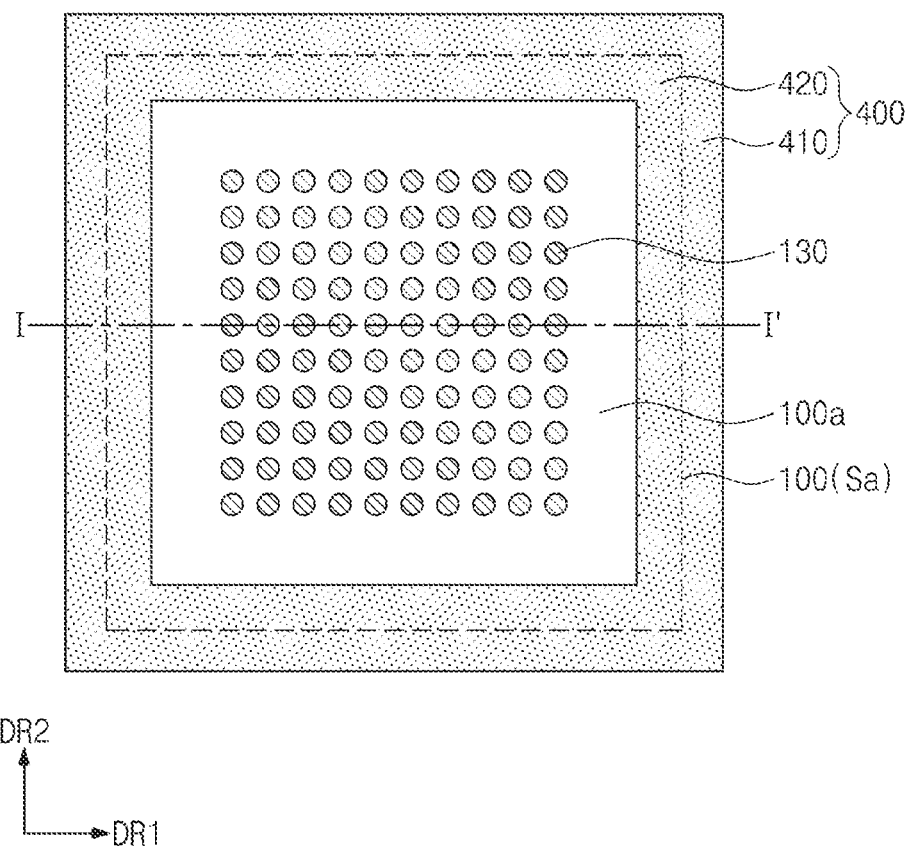
FIGS. 2 and 3 illustrate plan views showing a mold layer.
Figure 3:
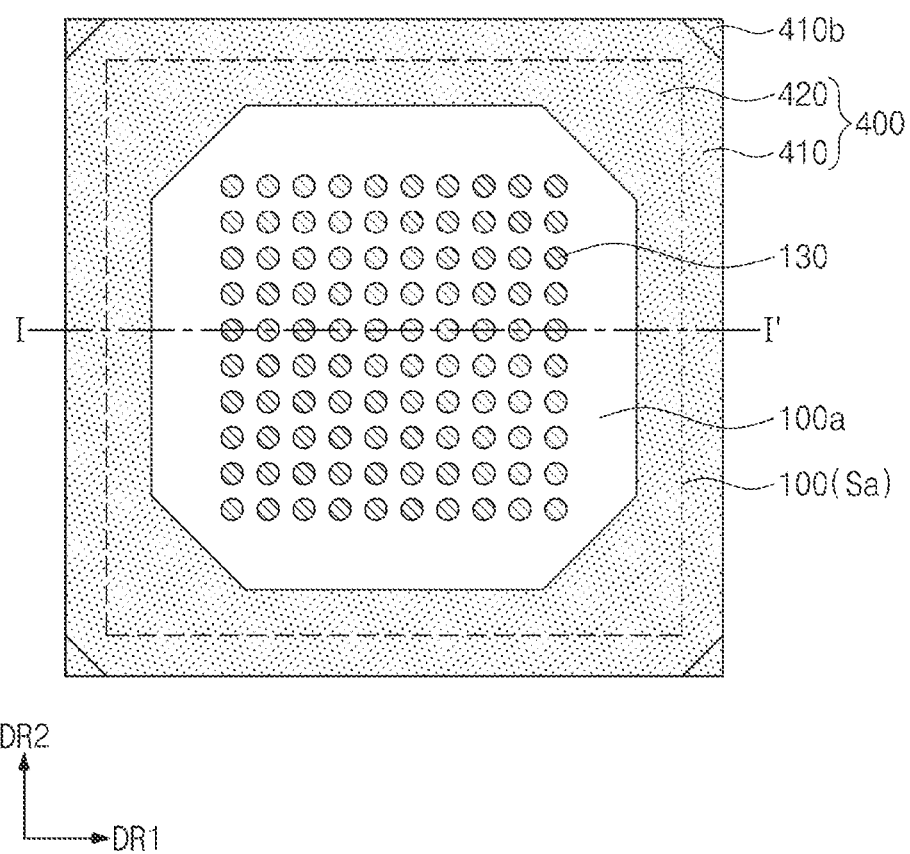

FIG. 1 illustrates a cross-sectional view showing a semiconductor package according to an example embodiment. FIGS. 2 and 3 illustrate plan views showing a mold layer, and FIG. 1 corresponds to a cross-sectional view taken along line I-I' of FIG. 2 or 3.

A chip stack S may be provided. The chip stack S may include a first semiconductor chip 100, one or more second semiconductor chips 200, and a third semiconductor chip 300.

The first semiconductor chip 100 may include a first circuit layer 110 and a first through electrode 120. The first circuit layer 110 may include a memory circuit. The first through electrode 120 may vertically penetrate the first semiconductor chip 100. The first through electrode 120 and the first circuit layer 110 may be electrically connected to each other. A bottom surface 100*a* of the first semiconductor chip 100 may be an active surface. For example, connection terminals 130 may be provided on the bottom surface 100*a* of the first semiconductor chip 100.

One or more second semiconductor chips 200 may be mounted on the first semiconductor chip 100. Each of the second semiconductor chips 200 may include a second circuit layer 210 and a second through electrode 220. The second circuit layer 210 may include a memory circuit. The second through electrode 220 may vertically penetrate the second semiconductor chips 200. The second through electrode 220 and the second circuit layer 210 may be electrically connected to each other. Bottom surfaces of the second semiconductor chips 200 may be active surfaces. First bumps 322 may be provided between the first semiconductor chip 100 and a lowermost one of the second semiconductor chips 200, electrically connecting the first semiconductor chip 100 and the lowermost second semiconductor chip 200 to each other. Second bumps 324 may be provided between the second semiconductor chips 200, electrically connecting the second semiconductor chips 200 to each other.

The third semiconductor chip 300 may be mounted on an uppermost one of the second semiconductor chips 200. For example, the third semiconductor chip 300 may be a topmost chip mounted on the top of the chip stack S including the semiconductor chips 100, 200, and 300. The third semiconductor chip 300 may include a third circuit layer 310. The third circuit layer 310 may include a memory circuit. A bottom surface of the third semiconductor chip 300 may be an active surface. Third bumps 326 may be provided between the third semiconductor chip 300 and the uppermost second semiconductor chip 200, electrically connecting the third semiconductor chip 300 and the second semiconductor chip 200 to each other.

An under-fill layer 330 may be provided between ones of the semiconductor chips 100, 200, and 300. The under-fill layer 330 may be interposed between ones of the bumps 322, 324, and 326, and thus electrical short circuiting may be prevented between the bumps 322, 324, and 326. The under-fill layer 330 may include an epoxy-based resin or an inorganic filler.

A mold layer 400 may be disposed on a side of the chip stack S. The mold layer 400 may cover a lateral surface of the chip stack S and a portion of a bottom surface of the chip stack S, which bottom surface may, for example, be substantially the same as the bottom surface 100*a* of the first semiconductor chip 100. The same reference numeral 100*a* may be used to refer both to the bottom surface of the chip stack S and to the bottom surface of the first semiconductor chip 100. For example, the mold layer 400 may include a first segment 410 on lateral surfaces of the first to third semiconductor chips 100, 200, and 300 and a second segment 420 on the bottom surface 100*a* of the first semiconductor chip 100. When viewed in plan, the first segment 410 may extend along lateral surfaces of the chip stack S. The first segment 410 may have a top end 410*a* at the same level as (e.g., flush, same height, etc.) that of a top end of the chip stack S and a bottom end 410*b* at the same level as that of a bottom end of the chip stack S, which bottom end may, for example, be the same as the bottom surface 100*a* of the first semiconductor chip 100. The second segment 420 may extend from the bottom end 410*b* of the first segment 410 onto the bottom surface 100*a* of the first semiconductor chip 100. When viewed in plan, the second segment 420 may overlap at least a portion of the first segment 410 and a portion of the first semiconductor chip 100. The mold layer 400 may then cover a bottom corner Sa of the chip stack S. The bottom corner Sa of the chip stack S may indicate a point where each of the lateral surfaces of the chip stack S meets the bottom surface 100*a* of the chip stack S. As illustrated in FIG. 2, the second segment 420 may cover an edge of the bottom surface 100*a* of the first semiconductor chip 100 and expose a center of the bottom surface 100*a* of the first semiconductor chip 100. The second segment 420 may expose the connection terminals 130, while being spaced apart from the connection terminals 130. A planar shape of the second segment 420 may be a loop shape substantially corresponding to a planar shape of the first semiconductor chip 100. In some embodiments, the second segment 420 may have a quadrilateral loop shape (e.g., a hollowed out quadrilateral) in a plan view. For example, the bottom surface 100*a* of the first semiconductor chip 100 may have a tetragonal shape at a portion exposed through the second segment 420. Alternatively, as illustrated in FIG. 3, the bottom surface 100*a* of the first semiconductor chip 100 may have an octagonal shape at a portion exposed through the second segment 420. In this case, the bottom end 410*b* of the first segment 410 may be partially exposed.

A first length L1 from the bottom surface 100*a* of the first semiconductor chip 100 to a bottom end of the connection terminals 130 may be greater than a second length L2 from the bottom surface 100*a* of the first semiconductor chip 100 to a bottom end of the second segment 420. For example, the second length L2 may be about 0.1 to 0.5 times the first length L1. If the first length L1 is less than the second length L2, the second segment 420 may prevent the connection terminals 130 from being in contact with a module substrate when the semiconductor package 10 is mounted on the module substrate. For example, when the semiconductor package 10 is mounted, the connection terminals 130 may melt to decrease in height. In this case, when the second length L2 is greater than about 0.5 times the first length L1, the second segment 420 may prevent the connection terminals 130 from being coupled to the module substrate. In order to securely obtain a minimum under-fill gap when the semiconductor package 10 is mounted, a difference between the first and second lengths L1 and L2 may be greater than about 4 μm. The mold layer 400 may include an epoxy molding compound (EMC).

Figure 4:
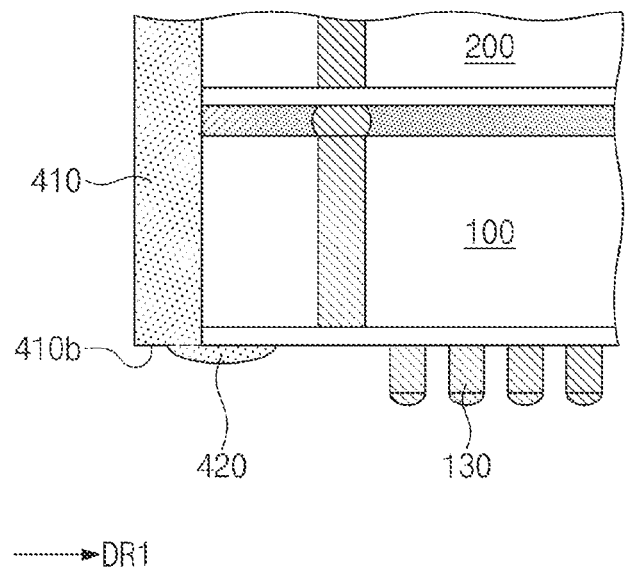
FIG. 4 illustrates a cross-sectional view showing a second segment of a mold layer.

FIG. 1 shows the mold layer 400 whose second segment 420 completely covers the bottom end 410*b* of the first segment 410, but the present disclosure is not limited thereto. FIG. 4 illustrates an enlarged cross-sectional view of the second segment of the mold layer, partially showing the semiconductor package. As illustrated in FIG. 4, the second segment 420 may be disposed on a boundary between the first segment 410 and the first semiconductor chip 100. When viewed in plan, the second segment 420 may cover a portion of the bottom end 410*b* of the first segment 410 and a portion of the first semiconductor chip 100, while exposing other portion of the first segment 410.

According to an example embodiment, the mold layer 400 may be formed from the lateral surface of the chip stack S to the bottom surface 100*a* of the chip stack S. The mold layer 400 may protect the bottom corner Sa of the chip stack S, which bottom corner Sa may be sensitive to mechanical impact, and thus the semiconductor package 10 may increase in structural stability.

Figure 11:
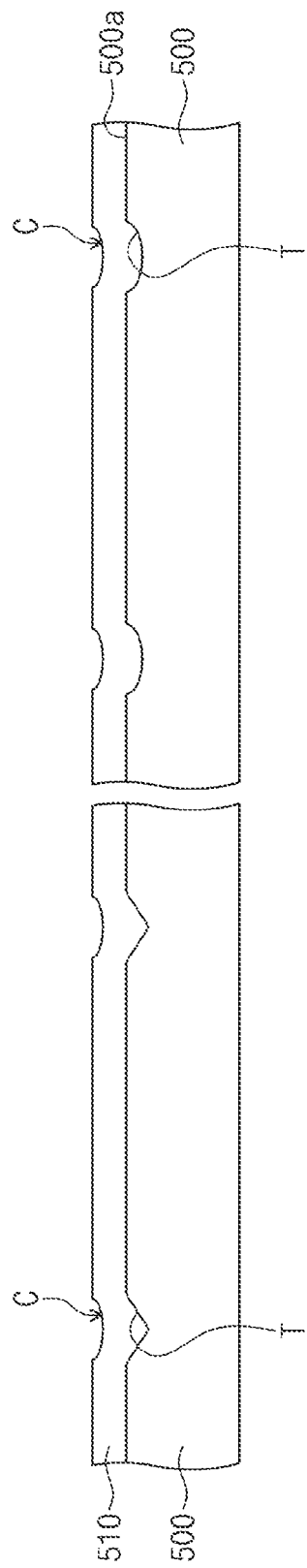
FIG. 11 illustrates a cross-sectional view showing a trench.
Figure 12:
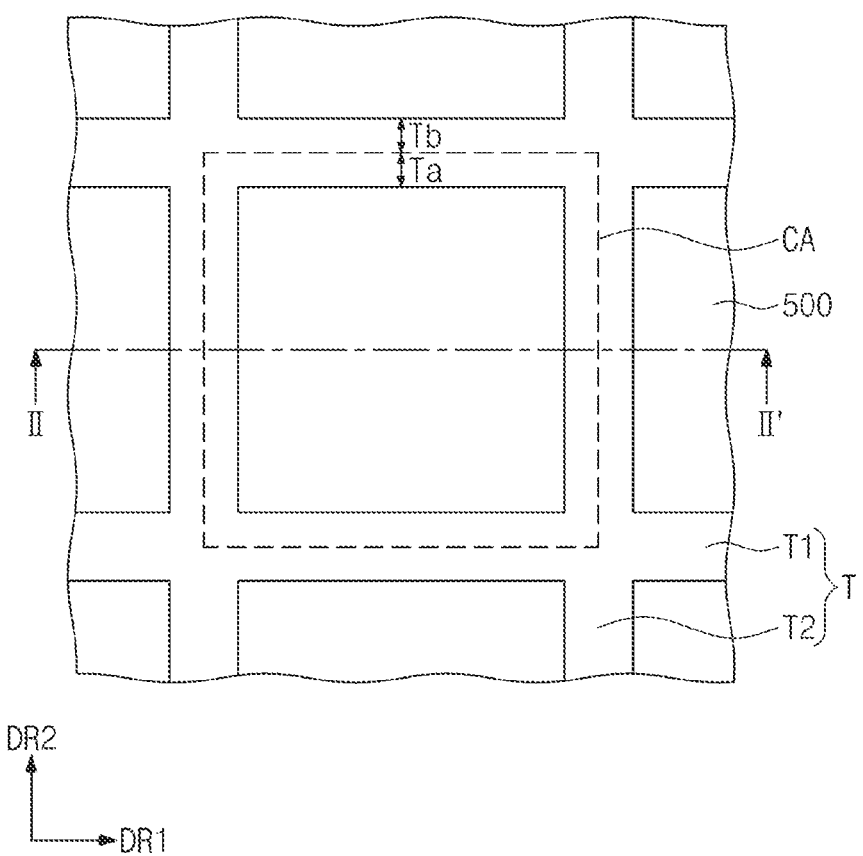
FIGS. 12 and 13 illustrate plan views showing a first carrier substrate.
Figure 13:
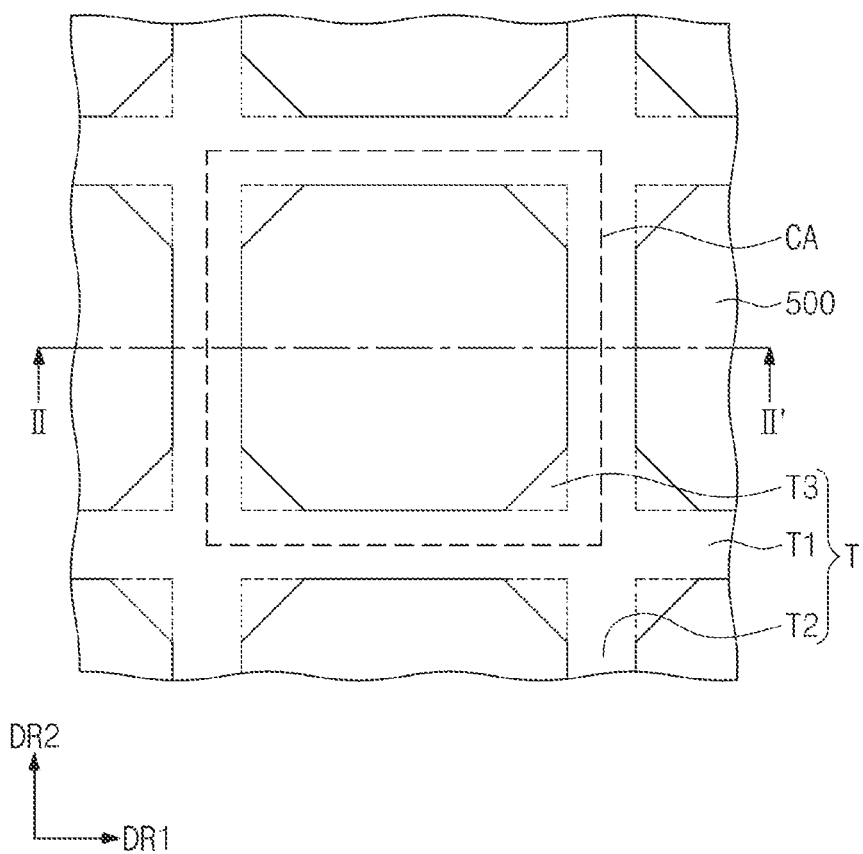

FIGS. 5 to 10 illustrate cross-sectional views showing a method of manufacturing a semiconductor package according to an example embodiment. FIG. 11 illustrates a cross-sectional view showing a trench. FIGS. 12 and 13 illustrate plan views showing a first carrier substrate, and FIGS. 5 to 10 illustrate cross-sectional views taken along line II-II' of FIG. 12 or 13. In the example embodiments that follow, components substantially the same as those discussed with reference to FIGS. 1 to 3 are allocated the same reference numerals thereto, and a repetitive description thereof will be omitted or abbreviated for convenience of description.

Figure 5:
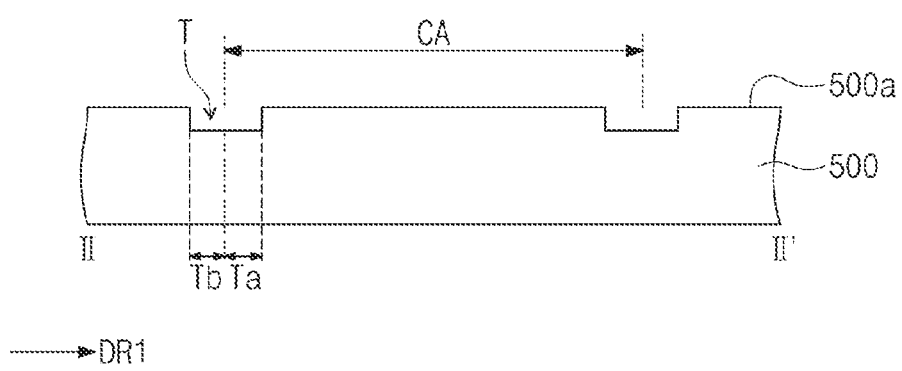
FIGS. 5 to 10 illustrate cross-sectional views showing a method of manufacturing a semiconductor package according to an example embodiment.

Referring to FIG. 5, a trench T may be formed on a first carrier substrate 500. The first carrier substrate 500 may include a silicon wafer or an insulating substrate such as glass or ceramic. The trench T may be formed by partially removing an upper portion of the first carrier substrate 500. For example, the trench T may be formed by performing an etching process such as drilling, laser ablation, or laser cutting. The trench T may extend from a top surface 500a of the first carrier substrate 500 toward the interior of the first carrier substrate 500. For example, the trench T may have a tetragonal shape when viewed in cross-section. Alternatively, when viewed in cross-section as shown in FIG. 11, the trench T may have one of semicircular and triangular shapes each of which has a width that decreases from the top surface 500a of the first carrier substrate 500 toward the interior of the first carrier substrate 500.

Referring to FIGS. 5 and 12, the trench T may define a chip-mount region CA where a first semiconductor chip (see 100 of FIG. 7) is mounted in a subsequent process. When viewed in plan, the chip-mount region CA may be surrounded by the trench T. For example, when viewed in plan, the trench T may be formed along an edge of the chip-mount region CA. The trench T may have a first zone Ta overlapping the edge of the chip-mount region CA and a second zone Tb outside the chip-mount region CA. The trench T may have a grid shape when viewed in plan as shown in FIG. 12. For example, the trench T may include first trenches T1 extending in a first direction DR1 and second trenches T2 extending in a second direction DR2 intersecting the first direction DR1. The first trenches T1 and the second trenches T2 may define areas each of which has a tetragonal shape, such as a rectangular or square shape. Alternatively, as illustrated in FIG. 13, the trench T may further include third trenches T3 in the vicinity of intersections of the first trenches T1 and the second trenches T2, which vicinity of the intersections may correspond to, for example, corners of the chip-mount region CA. The third trenches T3 may overlap the corners of the chip-mount region CA. The first trenches T1, the second trenches T2, and the third trenches T3 may define areas each of which has an octagonal shape.

In some example embodiments, when a plurality of semiconductor packages are fabricated at the same time, the first and second trenches T1 and T2 may define a plurality of areas divided from each other, which areas may be defined as a plurality of chip-mount regions CA on which a chip stack (see S of FIG. 9) is formed. For convenience of description, the following explanation focuses on an example including a single chip-mount region CA.

Figure 6:
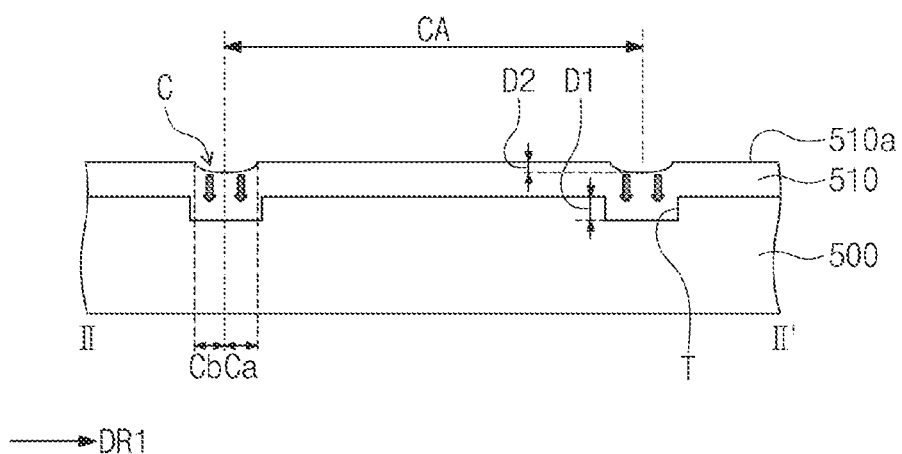

Referring to FIG. 6, the first carrier adhesive layer 510 may be formed on the first carrier substrate 500. The first carrier adhesive layer 510 may include a concave portion C vertically overlapping the trench T. For example, an adhesive member may be coated on the first carrier substrate 500. When the adhesive member is a fluid, gravity acting on the adhesive member may be greater than a surface tension of the adhesive member. The adhesive member may then have a top surface 510a that moves downward (e.g., sinks) into the trench T, as indicated by an arrow shown in FIG. 6. For the adhesive member on the trench T, the surface tension may cause the top surface 510a to have a round shape, regardless of the shape of the trench T. As discussed above, the concave portion C may be formed on an upper portion of the first carrier adhesive layer 510. The trench T may have a first depth D1 greater than a second depth D2 of the concave portion C. The concave portion C may have a third zone Ca overlapping the edge of the chip mount region CA and a fourth zone Cb outside the chip mount region CA.

Figure 7:
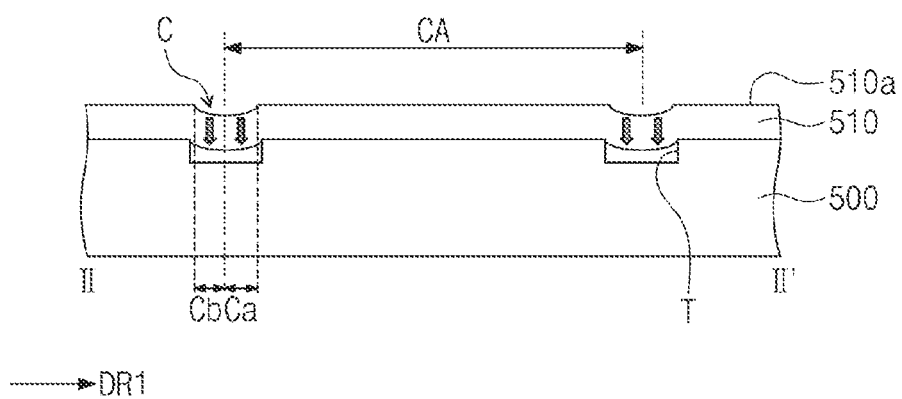

Alternatively, the first carrier adhesive layer 510 may be formed using a non-conductive film (NCF) that includes an insulating material. As illustrated in FIG. 7, the NCF may be a polymer tape including an insulating material. For example, the NCF may be adhered onto the first carrier substrate 500. The NCF may have a regular (e.g., uniform) thickness, and gravity may cause the NCF to move downward on the trench T, as indicated by an arrow shown in FIG. 7. The first carrier adhesive layer 510 may incompletely fill the trench T. As discussed above, the concave portion C may be formed on the upper portion of the first carrier adhesive layer 510.

Figure 8:
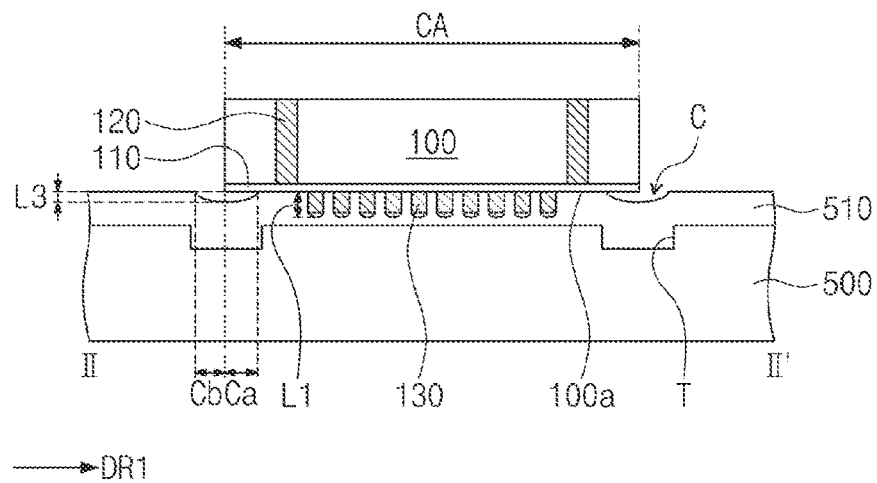

Referring to FIG. 8, a first semiconductor chip 100 may be adhered onto the first carrier substrate 500. The first carrier adhesive layer 510 may adhere the first semiconductor chip 100 onto the chip-mount region CA. Connection terminals 130 may be provided on a bottom surface 100a of the first semiconductor chip 100. The bottom surface 100a of the first semiconductor chip 100 may be in contact with the first carrier adhesive layer 510. Since the third zone Ca of the concave portion C formed on the first carrier adhesive layer 510 overlaps the edge of the chip mount region CA, an edge of the bottom surface 100a of the first semiconductor chip 100 may be positioned on the concave portion C. For example, the bottom surface 100a of the first semiconductor chip 100 may have a center in contact with the first carrier adhesive layer 510 and an edge spaced apart from the first carrier adhesive layer 510. The connection terminals 130 may be buried in the first carrier adhesive layer 510 and spaced apart from the concave portion C. A first length L1 from the bottom surface 100a of the first semiconductor chip 100 to a bottom end of the connection terminals 130 may be greater than a third length L3 from the bottom surface 100a of the first semiconductor chip 100 to a bottom end of the concave portion C. For example, the third length L3 may be about 0.1 to 0.5 times the first length L1. When the third length L3 is less than about 0.1 times the first length L1, a mold member (see 430 of FIG. 10) may have difficulty in being introduced into the concave portion C in a subsequent process. In order to securely obtain a minimum under-fill gap when mounting a semiconductor package (see 10 of FIG. 1) which will be fabricated later, a difference between the first and third lengths L1 and L3 may be greater than about 4 μm. The bottom surface 100a may be an active surface of the first semiconductor chip 100.

Figure 9:
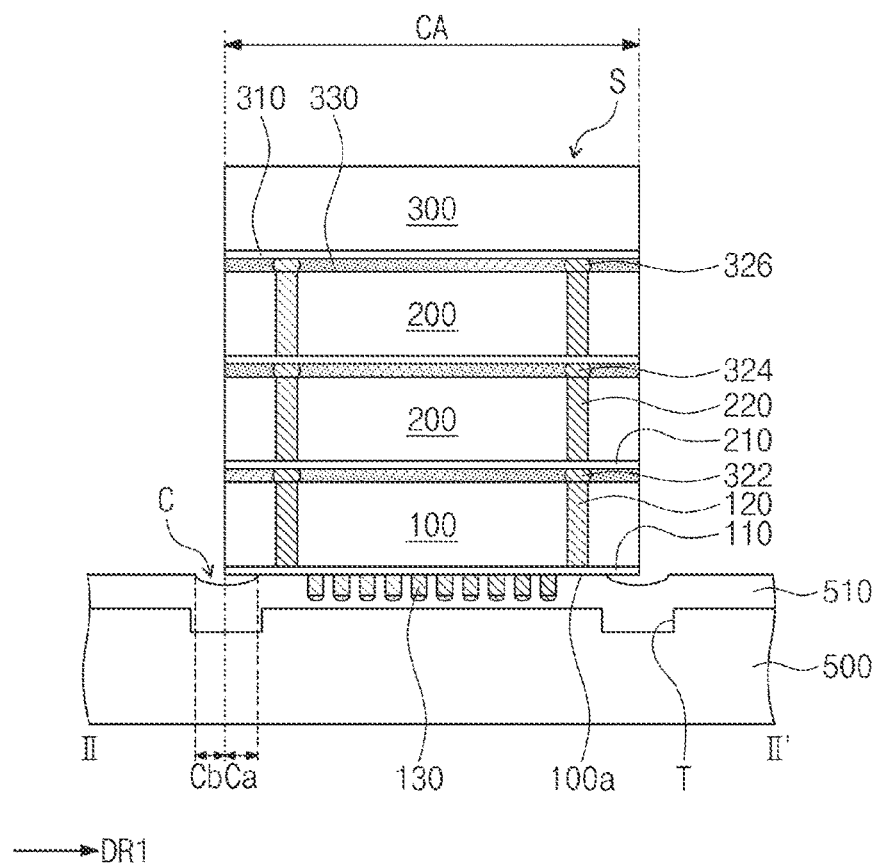

Referring to FIG. 9, second semiconductor chips 200 may be mounted on the first semiconductor chip 100. At least one second semiconductor chip 200 may be stacked on the first semiconductor chip 100. For example, solder balls and an under-fill layer 330 may be adhered onto a bottom surface (e.g., an active surface) of the second semiconductor chip 200, and the second semiconductor chip 200 may face down in such a way that the bottom surface of the second semiconductor chip 200 sets on a top surface (e.g., an inactive surface) of the first semiconductor chip 100. The solder balls may be reflowed to form first bumps 322. The first semiconductor chip 100 and the second semiconductor chip 200 may be provided therebetween with the under-fill layer 330 to prevent an electrical short circuit between the first bumps 322. The under-fill layer 330 may include an epoxy-based resin or an inorganic filler.

In a similar or identical manner, another second semiconductor chip 200 may be mounted on a top surface (e.g., an inactive surface) of the existing second semiconductor chip 200. For example, second bumps 324 may be formed between the second semiconductor chips 200, electrically connecting the second semiconductor chips 200 to each other. The second semiconductor chips 200 may be provided therebetween with another under-fill layer 330 to prevent an electrical short circuit between the second bumps 324. Although FIG. 9 shows a plurality of the second semiconductor chips 200, one or none of the second semiconductor chips 200 may be mounted on the first semiconductor chip 100.

A third semiconductor chip 300 may be mounted on an uppermost one of the second semiconductor chips 200, thereby forming a chip stack S. The third semiconductor chip 300 may be a topmost chip mounted on the top of the chip stack S including the semiconductor chips 100, 200, and 300. For example, solder balls and an under-fill layer 330 may be adhered onto a bottom surface (e.g., an active surface) of the uppermost second semiconductor chip 200, and the third semiconductor chip 300 may face down in such a way that a bottom surface (e.g., an active surface) of the third semiconductor chip 300 sits on a top surface (an inactive surface) of the uppermost second semiconductor chip 200. The solder balls may be reflowed to form third bumps 326. The uppermost second semiconductor chip 200 and the third semiconductor chip 300 may be provided therebetween with the under-fill layer 330 to prevent an electrical short between the third bumps 326.

Figure 10:
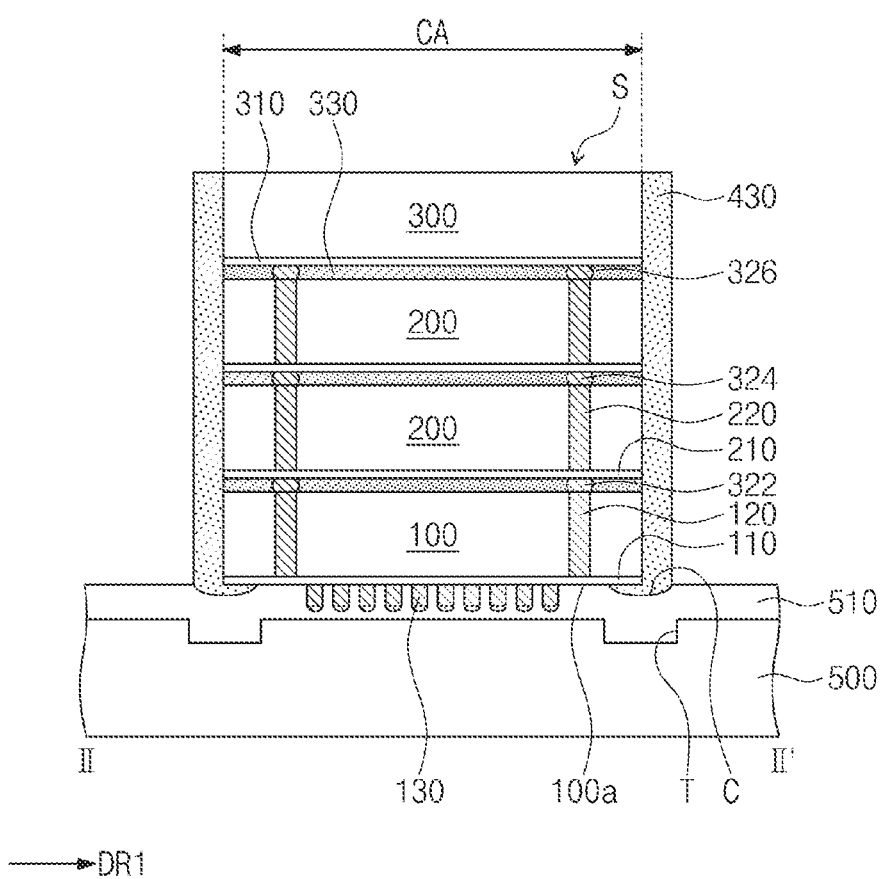

Referring to FIG. 10, a mold member 430 may be coated to surround lateral surfaces of the first to third semiconductor chips 100, 200, and 300. The mold member 430 may fill the concave portion C on the trench T, while covering the lateral surfaces of the first to third semiconductor chips 100, 200, and 300. Since the concave portion C of the first carrier adhesive layer 510 has a portion (e.g., the third zone Ca of FIG. 8) overlapping the edge of the chip mount region CA, the mold member 430 may cover an edge of the bottom surface 100a of the first semiconductor chip 100. The mold member 430 may be spaced apart from the connection terminals 130. The mold member 430 may include an insulating polymeric material. For example, the mold member 430 may include an epoxy molding compound (EMC).

Referring back to FIG. 1, the mold member (see 430 of FIG. 10) may be cured to form a mold layer 400. The mold layer 400 may be formed from a lateral surface of the chip stack S to the bottom surface 100a. The mold layer 400 may cover and protect a bottom corner Sa of the chip stack S.

In some example embodiments, when a large amount of the mold member 430 is provided to coat the chip stack S, the mold member 430 may be coated thick on the lateral surface of the chip stack S, and thus, as discussed with reference to FIG. 4, the mold layer 400 may be formed to have a first segment 410 and a second segment 420 that partially exposes a bottom end 410b of the first segment 410.

The first carrier substrate 500 may be removed to fabricate a semiconductor package 10. The first carrier adhesive layer 510 may also be removed.

In contrast, as discussed below, a chip stack may be partially exposed on its bottom and lateral surfaces when a carrier substrate has no trench.

Figure 14:
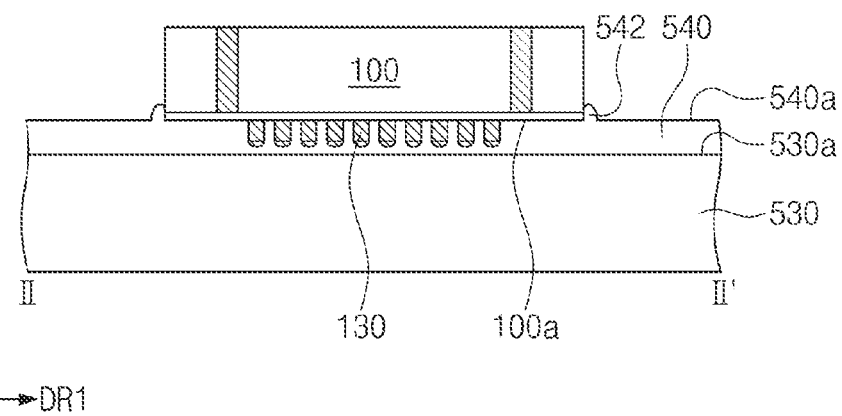
FIGS. 14 to 16 illustrate cross-sectional views showing a method of manufacturing a semiconductor package, which method uses a carrier substrate having no trench.
Figure 15:
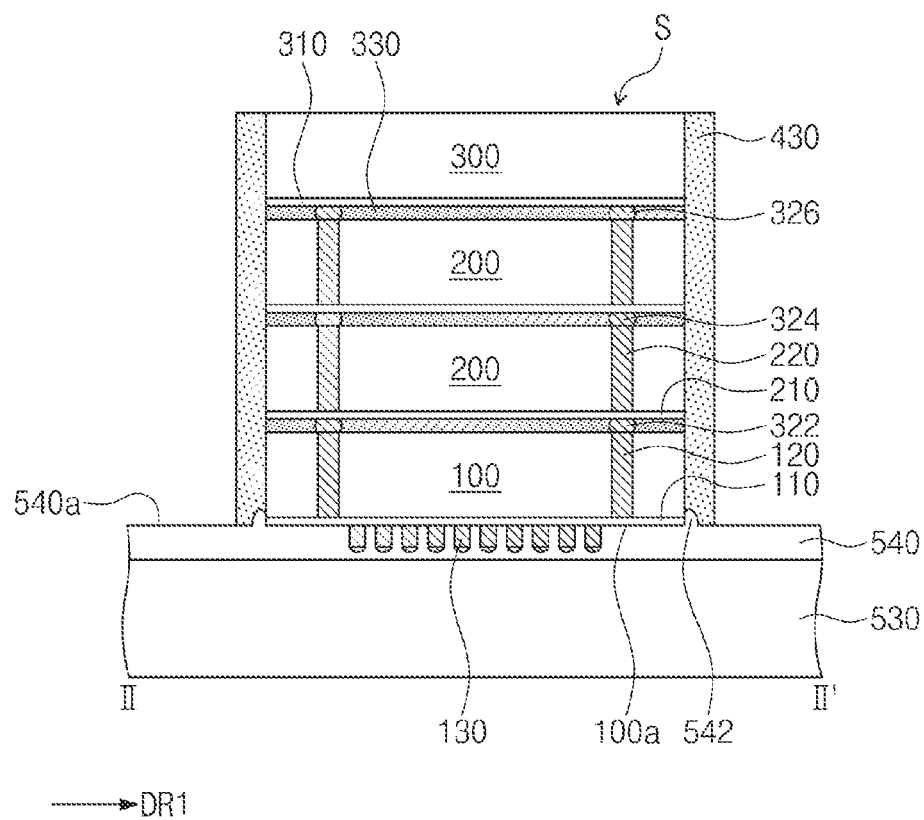
Figure 16:
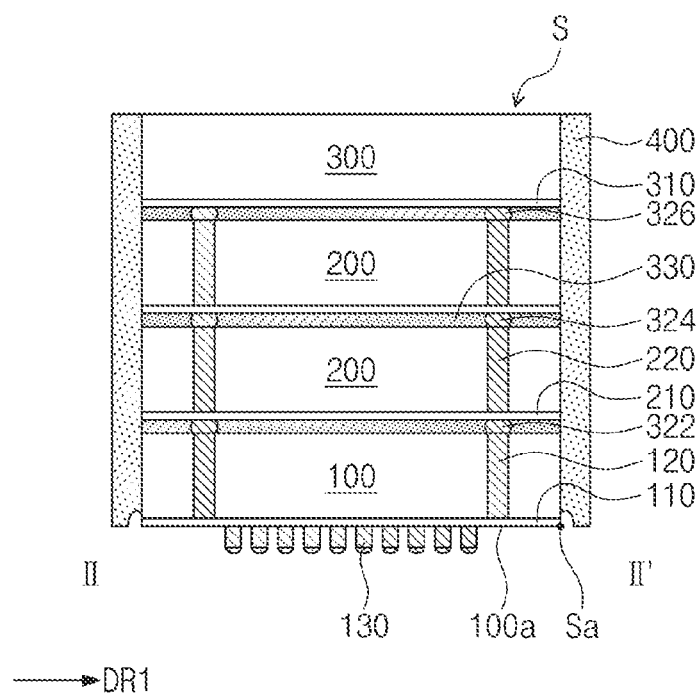

FIGS. 14 to 16 illustrate cross-sectional views showing a method of manufacturing a semiconductor package, which method uses a carrier substrate having no trench.

Referring to FIG. 14, a second carrier substrate 530 may be provided. The second carrier substrate 530 may have a flat top surface 530a. A second carrier adhesive layer 540 may be formed on the second carrier substrate 530. For example, the second carrier substrate 530 may be provided thereon with an adhesive member or an NCF. The second carrier adhesive layer 540 may have a flat top surface 540a. A first semiconductor chip 100 may be adhered onto the second carrier substrate 530. Connection terminals 130 may be provided on a bottom surface 100a of the first semiconductor chip 100. When the first semiconductor chip 100 is compressed in a direction toward the second carrier substrate 530, the second carrier adhesive layer 540 may protrude or overflow outside a lateral surface of the first semiconductor chip 100 during the time that the connection terminals 130 move into the second carrier adhesive layer 540. At this time, a portion of the second carrier adhesive layer 540 may protrude in a direction perpendicular to the top surface 530a of the second carrier substrate 530 along the lateral surface of the first semiconductor chip 100, and the protruding portion of the second carrier adhesive layer 540 may convert into protrusions 542.

Referring to FIG. 15, second semiconductor chips 200 may be mounted on the first semiconductor chip 100. At least one second semiconductor chip 200 may be stacked on the first semiconductor chip 100. A third semiconductor chip 300 may be mounted on an uppermost one of the second semiconductor chips 200, which step may form a chip stack S.

The lateral surface of the chip stack S may be provided thereon with a mold layer which will be discussed below. For example, a mold member 430 may be coated on lateral surfaces of the first to third semiconductor chips 100, 200, and 300. The mold member 430 may cover the protrusions 542 on the lateral surface of the first semiconductor chip 100, while covering the lateral surfaces of the first to third semiconductor chips 100, 200, and 300. The protrusion 542 may be placed between the mold member 430 and the lateral surface of the first semiconductor chip 100.

Referring to FIG. 16, the mold member 430 may be cured to form a mold layer 400. The mold layer 400 may be spaced apart from a portion of the lateral surface of the first semiconductor chip 100, while covering the lateral surface of the chip stack S.

The second carrier substrate 530 may be removed. The second carrier adhesive layer 540 may also be removed to expose a bottom corner Sa of the chip stack S. The bottom corner Sa of the chip stack S may be sensitive to mechanical impact, and when the bottom corner Sa of the chip stack S is exposed, a semiconductor package may decrease in structural stability.

In a method of manufacturing a semiconductor package according to an example embodiment, the first carrier substrate 500 may have the trench T in the vicinity of the bottom corner Sa of the chip stack S. Therefore, even when the first semiconductor chip 100 is compressed in a direction toward the first carrier substrate 500, the first carrier adhesive layer 510 may not protrude outside the lateral surface of the first semiconductor chip 100. The mold member 430 may fully cover the lateral surface of the first semiconductor chip 100 in a subsequent process. Therefore, the manufacturing method may reduce or suppress the occurrence of process failure in which the mold layer 400 exposes the lateral surface of the chip stack S. In addition, when the mold layer 400 is formed, the mold member 430 may cover an edge of the bottom surface 100a of the first semiconductor chip 100. For example, the mold layer 400 may be formed to protect the bottom corner Sa of the chip stack S.

In a semiconductor package according to an example embodiment, structural stability may be enhanced due to the mold layer 400 protecting the bottom corner Sa of the chip stack S.

Although the present disclosure has been described in connection with example embodiments illustrated in the accompanying drawings, it will be understood by one of ordinary skill in the art that variations in form and detail may be made therein without departing from the spirit and features of the example embodiments. The above disclosed example embodiments should thus be considered illustrative and not restrictive.

What is claimed is:

1. A semiconductor package comprising:
a chip stack comprising a first semiconductor chip, at least one second semiconductor chip mounted on a top surface of the first semiconductor chip, and a plurality of connection terminals disposed on a bottom surface of the first semiconductor chip which is substantially in parallel with the top surface of the first semiconductor chip; and
a mold layer surrounding a first lateral surface of the chip stack,
wherein the mold layer comprises:
a first segment surrounding a second lateral surface of the first semiconductor chip and a third lateral surface of the at least one second semiconductor chip, and
a second segment extending from a first bottom end of the first segment and covering an edge of the bottom surface of the first semiconductor chip,
wherein a cross-section of the second segment has a curved shape and a width that decreases with an increasing distance from the bottom surface of the first semiconductor chip.

2. The semiconductor package of claim 1, wherein a first length from the first semiconductor chip to a second bottom end of the second segment is 0.1 to 0.5 times a second length from the first semiconductor chip to a third bottom end of the plurality of connection terminals.

3. The semiconductor package of claim 1, wherein, when viewed in plan, the second segment overlaps a first portion of the first segment and a second portion of the first semiconductor chip.

4. The semiconductor package of claim 1, wherein the second segment is spaced apart from the plurality of connection terminals.

5. The semiconductor package of claim 1, wherein, when viewed in plan, the second segment has a loop shape covering the edge of the bottom surface of the first semiconductor chip and exposing a center of the bottom surface of the first semiconductor chip, and
wherein the second segment extends past the bottom surface of the first semiconductor chip along a direction perpendicular to and extending from the bottom surface of the first semiconductor chip.

6. The semiconductor package of claim 5, wherein the bottom surface of the first semiconductor chip exposed through the second segment has at least one of a tetragonal shape and an octagonal shape.

7. The semiconductor package of claim 1, wherein a first top end of the first segment and a second top end of the chip stack are level with each other, and
wherein the first bottom end of the first segment and a second bottom end of the chip stack are level with each other.

8. The semiconductor package of claim 1, wherein the cross-section of the second segment has a semicircular shape.

9. A semiconductor package comprising:
a first semiconductor chip;
a second semiconductor chip mounted on a top surface of the first semiconductor chip;
a plurality of connection terminals disposed on a bottom surface of the first semiconductor chip which is substantially in parallel with the top surface of the first semiconductor chip; and
a mold layer surrounding the first semiconductor chip and the second semiconductor chip,
wherein the mold layer comprises:
a first segment disposed beside of the first semiconductor chip and the second semiconductor chip; and
a second segment disposed below the first segment and the first semiconductor chip,
wherein a cross-section of the second segment has a curved shape and a width that decreases with an increasing distance from the bottom surface of the first semiconductor chip,
wherein the second segment exposes a center of the bottom surface of the first semiconductor chip, and
wherein the bottom surface of the first semiconductor chip exposed through the second segment has at least one of a tetragonal shape and an octagonal shape.

10. The semiconductor package of claim 9, wherein, when viewed in plan, the second segment has a loop shape covering a first bottom end of the first segment and an edge of the bottom surface of the first semiconductor chip.

11. The semiconductor package of claim 9, wherein a first length from the first semiconductor chip to a second bottom end of the second segment is 0.1 to 0.5 times a second length from the first semiconductor chip to a third bottom end of the plurality of connection terminals.

12. The semiconductor package of claim 9, wherein, when viewed in plan, the second segment extends from a first bottom end of a first portion of the first segment to the bottom surface of the first semiconductor chip.

13. The semiconductor package of claim 9, wherein the second segment is spaced apart from the plurality of connection terminals.

14. The semiconductor package of claim 13, wherein, when viewed in plan, the second segment surrounds whole of the plurality of connection terminals.

15. The semiconductor package of claim 9, wherein the first semiconductor chip and the second semiconductor chip form a chip stack,
wherein a first top end of the first segment and a second top end of the chip stack are level with each other, and
wherein a first bottom end of the first segment and a second bottom end of the chip stack are level with each other.

* * * * *